United States Patent [19]

Seeger, Jr. et al.

[11] Patent Number: 4,759,970
[45] Date of Patent: Jul. 26, 1988

[54] ELECTRONIC CARRIER DEVICES AND METHODS OF MANUFACTURE

[75] Inventors: Richard E. Seeger, Jr., Kittery, Me.; Noredin H. Morgan, Woburn; Joseph R. Landry, Jr., Burlington, both of Mass.

[73] Assignee: Amoco Corporation, Chicago, Ill.

[21] Appl. No.: 43,684

[22] Filed: Apr. 27, 1987

Related U.S. Application Data

[63] Continuation of Ser. No. 664,598, Oct. 25, 1984, abandoned.

[51] Int. Cl.$^4$ .................... B32B 3/00; B32B 5/16; H05K 1/00; H05K 1/18
[52] U.S. Cl. .................... 428/209; 428/328; 428/901; 174/68.5; 361/397
[58] Field of Search ............ 428/209, 328, 901; 106/1.18; 174/68.5; 361/397

[56] References Cited

U.S. PATENT DOCUMENTS

| | | | |
|---|---|---|---|
| 3,992,212 | 11/1976 | Youtsey et al. | 106/1 |
| 4,048,356 | 9/1977 | Bakos et al. | 427/379 |
| 4,147,889 | 4/1979 | Andrews et al. | 174/52 FB |
| 4,152,477 | 5/1979 | Harvta et al. | 428/209 |

Primary Examiner—John E. Kittle
Assistant Examiner—Patrick J. Ryan
Attorney, Agent, or Firm—Donald M. Papuga; William H. Magidson; Ralph C. Medhurst

[57] ABSTRACT

New chip carrier type devices have a substrate with a particle-loaded ink defining a plurality of distinct circuit paths. The circuit paths carry a conductive metal plating. The ink is designed with binder and adhesive means which are used to firmly attach the ink to the substrate which can be an organic resin.

12 Claims, 1 Drawing Sheet

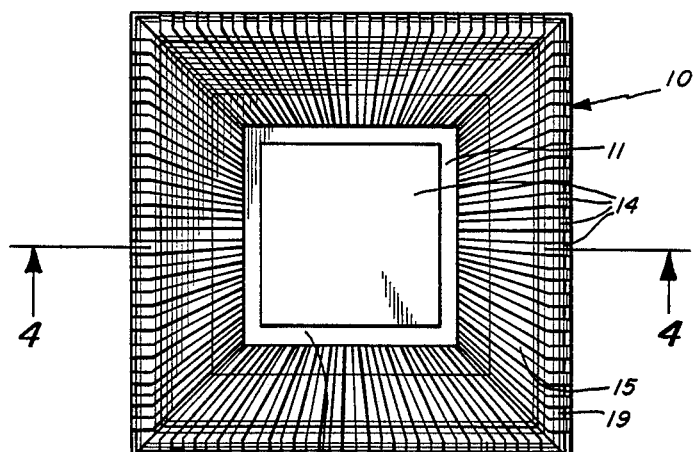
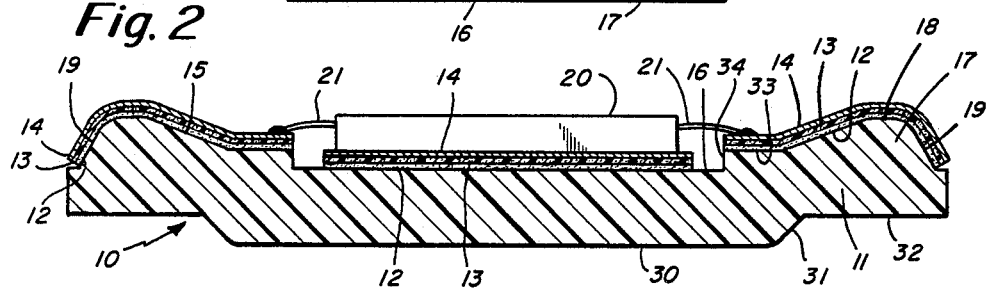
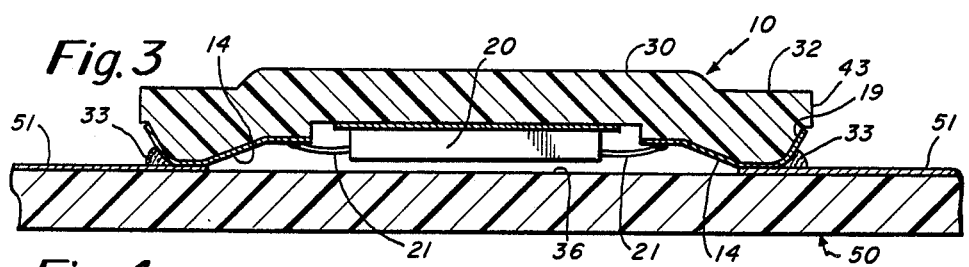
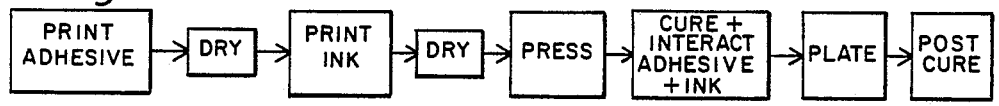
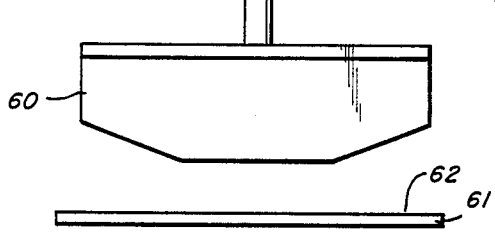
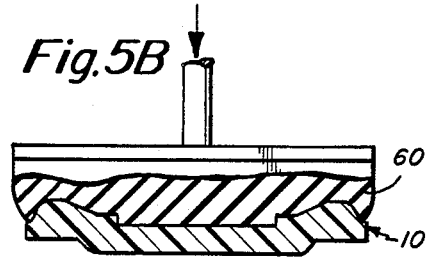

ELECTRONIC CARRIER DEVICES AND METHODS OF MANUFACTURE

This is a continuation of application Ser. No. 664,598, filed Oct. 25, 1984, now abandoned.

BACKGROUND OF THE INVENTION

Integrated circuit chip carriers are widely used in the industry. The chip carriers provide a means for mounting integrated circuitry to the circuitry of a circuit board to which the chip carriers are attached.

The most widely used chip carriers in the industry are made of ceramic bases on which electrically conductive circuit paths are formed. The pathways are often formed by the use of deposited metal particles in an organic polymer binder treated by firing to high temperatures as over 200° C. to remove the organic binder.

Developments in providing chip carriers are found in a variety of U.S. patents including the following U.S. Pat. Nos.: 4,366,342; 3,942,245; 3,483,308; 3,729,819; and 3,434,877. Patents of interest in the field further include: U.S. Pat. Nos. 3,909,838; 3,942,245; 3,975,757; 4,079,511; 4,147,889; 4,278,991; 4,366,342; 3,930,115; 3,936,866; 4,180,828; 4,220,917; 4,221,047; 4,339,621; 4,387,388; 4,398,208 and 2,959,498.

U.S. Pat. No. 4,147,889 discloses a chip carrier which includes a molded dielectric base of an organic resin in the form of a tray for receiving a chip. Conductive electric circuit paths of traces are separately mounted in the tray. However, the circuit paths are suggested to be formed by techniques known in the art with a specific statement that laminating and etching can be used. Subsequent to plating the patent suggests deforming the carrier into a dish configuration. Thus, the formation of the chip carrier is carried out in one form with subsequent forming to a three-dimensional form.

SUMMARY OF THE INVENTION

It is an object of this invention to provide improved three-dimensional devices comprising an insulated substrate and having electrically conductive paths thereon which devices can be rapidly formed in high speed production with accurate precise pathway arrangement having good resolution and good electrical conductivity.

Another object of this invention is to provide devices in accordance with the preceding object which are formed of electrically insulating organic resins and are particularly suitable for use as integrated circuit chip carriers.

Another object of this invention is to provide a device in accordance with the preceding objects which is highly resistant to thermal cycling due to the closeness of thermal coefficient of expansion between the three-dimensional device substrate and the substrate of a circuit board on which the device is mounted.

A still further object of this invention is to provide an improved method of forming a three-dimensional device in accordance with the preceding objects, which method is particularly suitable for use and printing in a three-dimensional form at high speed with good resolution.

Still another object of this invention is to provide a cost effective high speed manufacturing method in accordance with the preceding method which is particularly suitable for use in forming integrated circuit chip carriers.

According to the invention, a preferred three-dimensional device comprises an electrically insulation substrate, preferably of an organic resin, having a thickness and defining a first side surface having an electronic component mounting area, a flange extending at an angle from the mounting area and defining a lip area having an outer peripheral edge. A particle-loaded ink lies in a plurality of distinct circuit paths and extends from the vicinity of said mounting are toward said lip. The particle-loaded ink is bound to said substrate by a thermosetting resin and a conductive metal plating overlies the ink and provides high electrical conductivity to said circuit paths. When the substrate is an organic resin it has a coefficient of thermal expansion predetermined to match with that of common organic resin circuit board substrates so as to prevent delamination of said ink at expected thermal cycles encountered when chip carriers are mounted on the circuit boards.

Preferably the ink has a binder of a thermosetting resin and is applied over a thermosetting adhesive which aids in bonding the ink to the organic resin or plastic substrate. Preferably the particles in the ink are electrically-conductive metals but always are particles which contain a metal component and which permit good plating with high resolution. The plating is preferably a metal applied by electroless plating without activation, although in the case of certain inks activation may be needed.

Preferably the ink when printed on the chip carrier substrates passes the Plateability Standard Test and the completed products pass the Tensile Pull Strength Test as described in this specification.

According to the method of this invention a three-dimensional device such as a chip carrier is formed preferably on a resin substrate having a thickness and defining a first side surface having an electronic component mounting area, a flange extending at an angle from the mounting area and defining a lip area having an outer peripheral edge. The method comprises providing the device in a preformed three-dimensional configuration which is preferably injection-molded. A resilient compressible printing means and preferably a silicone pad is used to apply the printing ink to the three-dimensional surface of the substrate in a plurality of electrically conductive circuit paths or traces in a three-dimensional array with the ink having a thermosetting binder. The ink is adhered to the device and the paths are plated with an electrically conductive coating Preferably the plating is carried out by electroless plating techniques. The pad printer can be any resilient printing means although a silicone rubber pad is preferred. In the preferred arrangement, the ink is positioned onto a carrier flat base which is preferably a gravure ink-holding depression, which is struck by the resilient pad to pick up the ink and the ink transferred to the substrate to permit curing on the substrate. In the most preferred form, a curable binder of a thermoset organic material is first applied to the substrate before printing with the ink.

In one form of the invention the printing ink is formed of $Fe_2P$ particles in a binder. Although the ink layer is not itself electrically conductive it forms an excellent base after activation with palladium chloride for plating of conductive nickel.

It is a feature of this invention that conventional printing apparatus such as Tampoflex printers produced by Tampoflex GmbH of Stuttgart, Germany and Inkflex by Ink Applications Corp. of Wilmington, Mass.

can be used for the printing operation. High speeds can be carried out while still obtaining good resolution of electrically conductive traces with good electrical separation and excellent adhesion to the base or substrate. Matched coefficients of thermal expansion in the chip carrier substrate and circuit board base permit overcoming problems that can arise when using conventional ceramic devices due to the differential in coefficient of thermal expansion between ceramics and plastic printed circuit baseboards. The devices are tough and easily handled in automatic processing machines.

DESCRIPTION OF THE DRAWINGS

The above and other features, objects and advantages of the present invention will be better understood from a reading of the following specification in conjunction with the accompanying drawings in which:

FIG. 1 is a top plan view of an electronic chip carrier in accordance with the preferred embodiment of this invention;

FIG. 2 is a cross sectional view through line 2—2 thereof with the layers of adhesive and ink exaggerated for clarity;

FIG. 3 is a semidiagrammatic cross-sectional view through a chip carrier in accordance with FIG. 1 mounted on a circuit board;

FIG. 4 is a block diagram showing of a preferred method in accordance with the method of this invention; and FIGS. 5A and 5B are semidiagrammatic showings of the ink transfer process of the preferred embodiment of the method of this invention.

BRIEF DESCRIPTION OF PREFERRED EMBODIMENTS

With reference now to the drawings, the preferred embodiment of a chip carrier in accordance with this invention is illustrated at 10 in FIGS. 1 through 3. The chip carrier 10 is of conventional design except that it is preferably formed of an organic resin substrate 11 rather than the more-conventional ceramic. The upper surface of the substrate 11 has a first side which carries a curable thermosetting adhesive layer 12 and a particle-loaded ink layer 13 which is platable to carry a plating 14 which is electrically conductive. The ink can also be a conductive layer.

The substrate and chip carrier are in three-dimensional configuration providing an upwardly extending flange 15 extending about a mounting area or surface 16 at an angle to the substantially planar mounting area 16. The angle can vary as known in the art. An upper lip 17 provides an upper surface 18 which can be placed against electrical paths of a printed circuit board to which the chip is to be mounted in accordance with conventional practice. Preferably an outer peripheral lip edge 19 is provided at an angle to the upper surface 18 which permits formation of an electrically-conductive path lying in a plane at an angle to the flat plane of surface 18. This angle is particularly useful when reflow soldering the chip carriers to boards as will be described. The carrier shown in FIG. 2 is injection-molded and includes a flat botton 30, angled rim 31 and a surrounding outer flat border 32 forming the bottom of flange 15. Flange 15 has a mounting area wall rim 43. This configuration can vary greatly depending on the particular application of the chip carrier or other device.

An electrical component is diagrammatically illustrated at 20 and has leads diagrammatically illustrated at 21 attached to individual ones of the circuit paths or traces formed by the plating and ink 13, 14. A plurality of leads can come from the integrated circuit to the vast plurality of traces such as 14.

The particular number of traces can vary greatly. In many cases where printed circuits are used many leads are used which must be electrically connected to discrete circuit traces in an extremely small area. For that reason, it is important to have good resolution with electrical isolation of one trace from another. This can be difficult where printing inks are used to form the traces. The particular method of this invention is particularly useful to provide desired electrical isolation.

Using the methods of this invention, good resolution can be obtained if electrical paths are printed substrates parallel to each other and 0.008" apart.

FIG. 3 shows a conventional attachment of the chip carrier of this invention 10 to a printed circuit board 50 which can be of conventional design. The traces with their plating 14 are placed on the circuit paths 51 of the board 50 and soldered thereto by conventional means such as reflow soldering.

Note the solder filet 33 formed because of the plating over peripheral edge 19. This provides for better bonding and electrical continuity between the circuit paths of the chip carrier and those of the board.

The chip carriers of the present invention are dimensioned in accordance with any of the known configurations for chip carriers normally formed with ceramic substrates. For example, chip carriers fitting within dimensions of 0.4"×4" square to 2.5"×2.5" square are common. Although squares are common, rectangular and other shapes can be used and in some cases, the three-dimensional devices can be used for other purposes than chip carriers. In the conventional chip carrier, the flanges 15 extend upwardly at angles of from 20° to 60° with the top surfaces 18 substantially parallel to the mounting surface 16 although this is not required. The lip 17 can have a mounting surface which is rounded in cross section or in other configurations.

The baseboard or structural component of the chip carriers can be any dimensionally stable organic resin or plastic material and for example those known in the art. Such materials for the substrate include epoxy materials such as glass filled G-10 and FR4, phenolic materials, polysulfones such as Udel brand and polyamide ether such as Ultem brand, polyethylne terephthalate (Rynite) of Dupont DeNemours of Wilmington, Del., polyarylether, polyarylate and polyarylsulphide. In some applications the three-dimensional base can be of other materials such as glass or metal providing an insulating layer is provided, such as metal oxide, where metal bases are used so as to always have an insulting surface onto which the circuit materials of this invention are positioned.

The substrate can be thermosetting or thermoplastic of mixtures of the two. Preferably the substrates are resistant to temperatures normally encountered in assembly and use of the device as chip carriers namely temperatures in the range of from 50° C. to 260° C. and have thermal-coefficient of expansions in the range of from $1.1 \times 10^{-5}$ to $3.9 \times 10^{-5}$ per °C. Preferably the moisture absorption at saturation is 0.05% weight percent or less and more preferably 0.02% or less (using ASTM D570).

The substrate is normally used in thicknesses of from 0.04 to 0.10 inch although this can vary greatly depending upon the particular usage. The substrate base is preferably substantially rigid. In some cases heat sink areas on the mounting surface 16 can be used in accordance with known prior art practices.

The adhesive layer 12 is preferably a reactive resin and preferably a curable cross-linkable, thermosetting organic resin.

The adhesive may be any one or more of the many thermosettable resins known as adhesives or combinations of such resins with seemingly thermoplastic resins which are reactive sufficiently with the binder portion of the circuit element film and/or with another reactive resin with which it is blended so as to forma cured thermoset interfacial bonding layer between the adherend (the dielectric surface) and the other adherend (the ink circuit element film). The theories underlying adhesion are well developed, see e.g., Skiest, *Handbook of Adhesives*, 2nd Edition, 1977, pp. 11–16, published by Van Nostrand Reinhold Company, New York, N.Y., U.S.A. A wide variety of adhesive materials is employable in the practice of this invention. Without intending to be limited, a preferred adhesive combination is the mixture of an acetal resin, viz. polyvinyl acetal, and an epoxy resin, as generally described by Skiest, supra, pp. 507–527. Particularly good results are obtained from a blend of polyvinylbutyral or polyvinylacetal and an epoxy substituted novolak as described below. Other desirable adhesives include thermoplastic polyester polyurethanes crosslinked by polyfunctional blocked isocyanates whereby crosslinking is achieved by binret and/or allophanate linkages. Straight epoxy systems are desirable such as the cycloaliphatic epoxies blended with polyols such as polycaprolactone polyols. Where interreaction is achievable by catalysis, a catalyst is supplied. Many resin systems are crosslinked to a cured condition using heat alone. Where the dielectric surface of the chip carrier is pre-preg, then the resin used in forming the final composite of the dielectric surface may also be used as the adhesive layer or interface. The options in respect to adhesives are many and varied. Many additives may be incorporated into an adhesive formulation as known in the art.

The adhesive is preferably printable by pad printer although it can be applied by any means. In some cases the adhesive layer overlies the entire surface about the flange and lip and peripheral edge since it is less expensive in some cases to apply the adhesive in that manner. However, it is also possible to apply the adhesive by a pad printing technique where only portions underlying the electrically conductive traces 13 are applied after which the traces 13 are printed over the adhesive layer. Normally the adhesive is used in a thickness of from 0.0001 to 0.0004 inch dry.

The printing ink layer 13 is of necessity a printing ink carrying metal component-containing particles which provides for good platability. The printing ink can have high electrically-conductive properties although such properties are not absolutely required where plating is carried out. In the preferred embodiment the metal component is an electrically-conductive metal.

Suitable inks include particle-filled inks having as binders curable, thermosetting materials with reactive groups capable of reacting with the adhesive layer. Such binders include thermosetting resins such as epoxy, epoxy novolac or glycerol ether bis-phenol A, phenolic, melamine, polyisocynate, polymamide, polyimide, acrylic, urea formaldehyde, polyester and cross linked or reactive urethane systems.

Especially preferably binders include phenol blocked isocyanates reacted with novolac epoxides alone or blended with polyvinyl acetals, e.g., polyvinyl butyral or polyvinyl formal resins. The blocked isocyanates may be deleted from such resin if desired.

The particles and binder are mixed together in a high boiling solvent preferably with slow evaporation characteristics to form a slurry (the ink). Suitable solvents include cellosolve acetate, n-butyl carbitol, n-methyl-2-pyrolidine, N, N-dimentyl formamide, dimethyl sulfoxide, ethylene glycol, anisole, decaline, diethylene glycol diethyl ether, aniline, diethylene glycol dibutyl ether, diethylene glycol diemthyl ether, glycerol, tetralin, xylene, ethylene glycol monoethyl ether, chlorobenzene, diethyl carbonate, butyl acetate, ethylene glycol monomethyl ether, toluene and the like. The solvent is vaporized during the curing rocess. The amount of resin in the ink on a dry basis is from about 46 to about 13 preferably from about 32 to about 13 percent of the volume fraction.

The particles are metal component containing and preferably metal-containing and are loaded in the ink in high amounts in the range of from 54 to 87 and preferably 68 to 87 percent of volume fraction based on the volume of the dry film where metal-containing particles are used. Suitable inks include those with electrically conductive metal. In one embodiment, precious or noble metals such as silver, gold, platinum, palladium, rhodium and ruthenium particles are used. The metal particles may comprise at least one of the metals from groups 5b, 6b, 7b, 8, 1b, 2b and 3b of the periodic table of elements. Mixtures of particles can be used such as mixtures of silver, gold and/or palladium with the remainder being particles of other metals or solids such as nickel, copper, zinc, aluminum, gallium, glass, metal oxides and nonmetal oxide solids such as silica, mica and the like. In some cases metal coated ceramic particles such as metal coated glass or silica particles can be used. The precious metal, when used, preferably comprise at least 15% by weight up to 100% by weight of the particles in the composition and most preferably 20% by weight. Most preferably, the precious metals comprise at least 20% by weight of the particles in the ink composition. In one preferred embodiment, the precious metal is silver in the from of flakes or platlets or rods allowing for maximum contact within the thermoset resin layer binder. The shape of the particle components is not narrowly critical so long as it allows adequate silver to silver contact in the layer to provide the level of electrical conductance where electrical conductance is sought in the ink rather than obtained solely through the use of a conductive plating. When silver is used, silver flake can be used with metal particles such as nickel or tin. A particularly desirable combination is 25% to 50% by weight of silver particles and 75% to 50% by weight of nickel particles based on the particulate content only. Another preferred composition is one where the metal containing ink particles are nickel particles. The nickel particles can be for example 3 to 5 micron particles of equi axis shape. The nickel particles can be ball milled to platelet shape with aspect ratio of from 5 to 20 to 1 to 20. The nickel particles do not provide high electrical conductivity to the ink but do provide for good plating.

Still another preferred embodiment for the particles of the ink comprise the use of ferric phosphorus such as ferrophoS a trademark product of Hooker Chemical Company. Ferric phosphorus has substantially little electrical conductivity as an ink in accordance with the invention but is highly printable with good resolution and little or no smearing even when printed in traces close together, as for example, 8 mil apart. The ferric phosphorus is platable but must be activated with palladium chloride solutions to the allow electroless plating and thus is not as desirable as use of nickel or silver-nickel or other particle containing ink combinations which do not require activation for electroless plating. Particle sizes of metal component particles in inks of this invention can vary greatly. $Fe_2P$ can vary from 3 to 22 microns in average particle size. Nickel particles can vary from 2 to 40 microns. Preferably the particles pass a 100 mesh size screen U.S. Sieve Standard and most preferably pass a 200 mesh size screen and are retained on a 350 mesh size screen U.S. Standard.

The metal component-containing particle and binder of the ink are mixed together in a high boiling solvent to form a slurry which is in effect the ink. Suitable solvents are known in the art as previously described.

The solvent is vaporized during the curing process. The amount of resin in the ink on a dry basis can be from about 2 to about 7 and preferably from about 4% to about 6% by weight.

The metal component particle is preferably present in the slurry in amounts of from at least 93 to about 98% by weight on 100% solids basis. When electrical conductivity is to be obtained from the metal, it is preferred to use preferably from 93% to 98% to achieve a desired level of conductivity as for example a surface resistivity of below 0.5 ohms/square and preferably from 0.1 to 0.005 ohms/square. Expressed in another way, the metal component particles preferably should be from about 54% to about 87% by volume of the volume fraction based on the volume of the dry film.

Preferably the inks of this invention which are metal particle carrying inks are designed so that the dried inks pass the Plateability Standard Test as defined below and chip carriers carrying the inks all pass the Tensile Pull Strength Test. These tests are described below.

PLATEABILITY STANDARD TEST

This test defines the criteria by which the capability to apply, adhere and maintain adhesion of electroless nickel plating to the printed ink is determined.

(Note: This is not a plating standard test which would define quality, quantity, and process control related yield values. In addition, this test only has significance with respect to chip carriers or devices in which metal particle containing inks are used and is not relied on with respect to devices formed with $Fe_2P$ inks.)

In the Plateability Standard Test, a plastic chip carrier substrate, having additive lines each distinct physically and electrically separated from each other, is prepared for the electroless plating process using Enthone Ni 418 (manufactured by Enthone, Inc., West Hartford, Conn., U.S.A.) at 88° C. for 45 minutes. The carrier is as shown in FIG. 1 and has a 0.72×0.72 inch size and carries printed circuit lines of this invention in a pattern of 64 radiating lines approximately 0.3 inch in length, having a line width of 0.012 inch to 0.025 inch.

A value satisfying the Plateability Standard Test is defined inclusively as:

1. 100% coverage of any distinct line which accepts the plating, (as determined by a 10× magnification visual examination).
2. no less than 95% of the lines must accept plating.

In addition to passing the test values above, the most preferred products of this invention have the following features:

1. Substantially all lines that accept plating are free of blisters and cracks (as determined by 10× magnification visual inspection), and
2. Substantially all lines that accept plating adhere and maintain the plating as determined by an adhesion peel test per I.P.C. Test Methods Manual Method Number 2.4.1., in which no plating may separate from the printed circuit interface. This test is performed both before and after submission to a salt spray environment per ASTM B-117 (5% neutral salt spray at 95° F. for 72 hours).

In addition both the metal particle inks above and the $Fe_2P$ type inks below pass the pull strength test described below:

Tensile Pull Strength Test

With respect to the pull strength of the circuit element, i.e., the soldered interface to a printed circuit board, (as shown in FIG. 3) it should be a minimum value of 150 p.s.i. (pounds per square inch) tensile pull for the plated circuit element in order to satisfy the requirements of pull strength for this test. In this regard, the test is not the peel strength test, see Coombs, supra, page 19-23, but a test similar to it. This procedure measures the tensile strength of the bond of a Ni plated circuit element (as described in the plateability section herein) and measures ultimately either adhesive or cohesive failure of the composite.

The specimen is identical to the plateability standard having the configuration of FIG. 3. The carrier is soldered to a conventional substractive process aminated copper epoxy glass circuit board interfacing at 64 locations, each having a solder contact area of 0.020 inch by about 0.050 inch. The solder is Sn60 or SN62 containing flux type RA or RMA.

The specimen is mounted in a tensile (pull) test machine such that a tensile load is applied through the center of the carrier. The test machine (Instron model 1130 made by Instron Corp. of Canton, Mass.) has a constant velocity capability of 1 inch/minute ±2% pull and a force capability of 100 lbs. full scale, and 10 lbs. full scale, with a force sensitivity of ±1% of full scale. A chart recorder of similar sensitivity shall be used for data acquisition.

The recorder is calibrated to zero and then start the pull at 1 inch/minute. Record the force at failure. The force (lbs.) is divided by a factor of 0.064 to determine the tensile strength in p.s.i.

The plated layer 14 is an electrically conductive layer that can be of any metal. The plating is preferably carried out by electroless plating with nickel being an ideally suitable plating material. Plating thicknesses of from 0.003 to 0.0008 inch and more can be used. Above 0.0016 inch for plating becomes commercially undesirable. An electroless nickel plating solution such as Enthone Ni418 manufactured by Enthone, Inc. of West Hartford, Conn. is a particularly-suitable electroless nickel coating solution. Plating rates of 0.0004 to 0.0005 inch per hour can be easily attained. Plating can be carried out for periods of from 25 to 90 minutes or more of temperatures of from about 83° C. to about 88° C.

Electroless plating in well-known in the art as, for example described in *PLATING*, October 1959, "An Outline of the Chemistry Involved in the Process of Catalytic Nickel Deposition from Aqueous Solutions", G. Gutzeit.

In some embodiments, the materials can be activated prior to plating as in the case of $Fe_2P$ wherein palladium chloride activation is used. Other electroless plating layers that have good electrical conductivity can also be used. For example nickel, copper or gold plating can be used for layer 14. In some cases two platings can be used to improve wire bonding as, for example, gold plated over an electroless nickel layer.

It has been found that wire bond techniques for connecting electrical components to the chip carriers can be used. However, the integrity and bond characteristics are enhanced if the chip carrier printed ink lines are first treated in accordance with this invention to compress the ink before plating. The compression step can be carried out in a suitable die. The substrate which can be injection or compression molded and can have traces of ink thereon is placed in a form and a press brought down to provide flat surfaces compressing each ink trace at least at its area to be bonded to leads such as the inner perimeter of the traces. Pressures of from 500 to 2000 psi which are non-destructive to the ink traces for time periods of from 3 to 15 seconds at temperatures of from 350° F. to 600° F. are preferably used. The times, temperatures and pressures can vary depending on the ink and substrate used. Non-destructive parameters are easily chosen. In a preferred embodiment, 1800 psi for 10 seconds is applied at 475° F. This provides a flatter, better surface for bonding after the ink is later plated in accordance with this invention. Wire bonding is then easily carried out with good bond integrity and electrical conductivity.

The inks of this invention are preferably designed to have a viscosity in the range of from 70,000 to 410,000 cps, Brookfield Viscometer spindle 7, speed 2 at 29° C. so as to be transfer printable. The ink used before plating has a dry thickness of from 0.0005 inch to 0.0015 inch while the plating thicknesses are from 0.002 to 0.005 inch or higher and preferably about 0.004 inch. The adhesive layer preferably has a dry thickness of from 0.001 to 0.005 inch.

The completed products have electrical paths or traces (formed by the ink having a conductive plating thereover) which are densely loaded on the upper surface of the chip carrier. The plated traces can have widths of from 0.0012 to 0.050 inch and be spaced from 0.020 to 0.100 inch apart. Preferably tensile pull strengths of at least 150 psi are obtained. The devices are resistant to thermal cycling at temperatures of from 50° C. to 150° C. at a rate of one cycle per hour up to 100 hours and more. The devices pass the Plateability Standard Test and the Tensile Pull Strength Test when metal particle-containing inks are used.

Turning now to the method of this invention, the steps in the method are diagrammatically shown in FIGS. 4 and 5. Basically a chip carrying substrate in a three-dimensional form is provided. The method can be carried out on all substrates including ceramic substrates although in its preferred form, significant advantages are obtained when the substrate is an organic resin or plastic. The substrate is preformed into a three-dimensional form such as the form of FIG. 1. When the substrate or base is thermoplastic it can be injection-molded or otherwise preformed. Thermoplastic substrates can be preformed using standard molding or forming techniques such as compression molding. Adhesive is printed by the use of a yieldable printing means of this invention.

In the preferred form, the printing means is a three-dimensional pad 60 mounted on a moveable piston shaft. The ink is positioned in a desired pattern, as by use of standard gravure techniques, on a carrier plate such as 61, or otherwise formed on the carrier plate in the desired electric path configuration. That configuration can be as shown in FIG. 1. The three-dimensional pad such as 60 or other compressible means is applied to the carrier surface 62 to pick up the electrical path configuration formed by the ink as shown in FIG. 5A. The ink is then transferred to an underlying preformed three-dimensional insulating substrate of chip carrier type device and applied thereto. The pad is resiliently deformed to print the desired pattern on a three-dimensional surface as shown in FIG. 5B. Silicone rubber pads are particularly useful to carry out the transfer. Surprisingly, the highly-metal component particle-carrying ink is transferred wih good resolution at high speed in the process of this invention. Preferably, an adhesive layer of a durable thermosetting resin is applied prior to the ink so as to provide a reactive adhesive interlock between the ink and the underlying layer. The adhesive and ink binder are as described previously, which permits interaction of the materials.

As shown in FIG. 4, the adhesive is first printed on the chip carrier either in the pattern in which the ink is to be applied thereover or throughout the upper surface if that is simpler and faster. Preferably drying is then carried out as, for example, for three to five minutes at 200° F. to remove the solvent from the adhesive.

The ink is then printed with the printer pad 60 which picks up the ink from the carrier layer 61 as described above. Preferably a single hit of the pad is used although in some cases in order to provide sufficient ink deposit, two or more hits of the pad to the three-dimensional carrier are carried out.

A second drying step is preferably used to remove the ink solvent at three to five minutes at 200° F.

The dried printed ink traces are then preferably pressed as previously described to improve wire bonding characteristics of the final product.

After the pressing step curing is carried out to cure and interact the adhesive and ink to form the final bond between the substrate and the ink. Depending upon the particular materials used, the time and temperature can vary although times of from 20 to 40 and preferably 30 minutes at from 360° F. to 392° F. and preferably 360° F. has been found desirable.

In a next step, plating is carried out by conventional electroless plaalting preferably of nickel, copper or gold to form an electrically conductive layer as known in the art with the electrically conductive circuit patterns or pathways having a surface resistivity of no more than 0.05 ohms per square. Electroless metal plating is well-known in the art. Metallic coatings are deposited on solid catalytic surfaces through a process of chemical reduction. No electric current is required. Under the right conditions positive ions (cations) are freed from solution and the reduced metal forms a unique metallurgical material, sometimes referred to as metallic glass because it has little crystalline structure. Uniform coatings are normally formed which are almost free of pores in most cases. The platings are often corrosion resistant and can be heat treated when necessary to decrease brittleness. It should be noted that where $Fe_2P$ is used, a conventional activation step is first used as known in the art prior to plating, although in the preferred embodiments where metal particle-containing inks are used, no activation is necessary.

After plating, in a final step, post-curing is preferably carried out as for example at 20 to 40 minutes and preferably 30 minutes at 360° F. to 392° F. to finalize the cross linking and interaction of the adhesive and ink binder.

The chip carriers are then completed and integrated circuits can be mounted in accordance with conventional procedures.

The chip carrier to board assembly follows conventional procedures and can use conventional production equipment. For example, 0.005" to 0.008" of Sn62 (RMA) solder paste can be applied to the circuit path traces of a conventional printed circuit. The chip carrier of this invention is then aligned with its traces aligned with those of the board to which it is to be joined with the carrier setting on the paste. Drying is carried out and vapor phase soldering with, for example, 60 seconds at 215° C. reflow and 15 seconds at 90° C. dwell time use to complete the procedure.

It should be understood that there are many variations in the processing of this invention. The key step is the use of a compressible transfer means such as a silicone rubber pad 60 to pick up a conductive pathway pattern fromaa carrier surface such as 62 or other means and transfer it to a three-dimensional insulated base to allow rapid production of highly-conductive, mechanically-strong electrically conductive paths in electrical products such as chip carriers. The silicone rubber pad 62 can be other resilient materials and/or in other forms such as a silicone rubber roller which is used to pick up and transfer the pattern.

While the pattern is preferably formed on a carrier surface such as 62 by conventional gravure techniques, other methods can be used. For example the carrier surface can be a gravure plate with preformed patterns in conventional gravure-type transfer with gravure rubber roller pads used in a rolling action. Similarly the pressing of the surface in step 5B can be carried out by a roller action rather than a single pad-like action. In all caess because a resilient transfer means is used, three-dimensional printing can be carried out. Preferably the ink used in suitable for gravure printing. Similarly the adhesive is suitably formulated with solvents so as to have a screenable viscosity suitable for printing or spraying, as desired.

The following examples serve to give specific illustrations of the practice of this invention but are not intended in any way to act to limit the scope of this invention.

Example 1.

A chip carrier such as 10 is formed of a substrate molded from a glass filled polyethylene terephalate material such as Rynite 555 obtained from DuPont Co. of Wilmington, Del., having tensile strength of 28,500 p.s.i. (ASTM 638) heat deflection temperature (264 p.s.i.) of 445° F. (ASTM D648), a coefficient of linear thermal expansion of $1.3 \times 10^{-5}$ in/in/°F. (ASTM D696) and a moisture absorption (24 hours at 73° F.) of 0.04% by weight (ASTM D570).

The substrate composition is molded at 300° C. in a cavity mold using a hydraulic press to form a three-dimensional chip carrier substrate as described in the Plateability Standard Test where the thickness of the substrate varies in cross section from about 0.03 inch to 0.08 inch.

Separately, a two part adhesive containing the following ingredients is prepared:

Part A (I) 11.41 parts by weight of an epoxy resin derived from epichlorohydrin and bisphenol A (Epon 1009F obtained from Shell Chemical Co.), (II) 40.8 parts by weight of a saturated polyester having an average equivalent weight of 260, a hydroxy content of 6.5%, a maximum acid number of 4.0, an approximate specific gravity of 1.12 at 25° C. (Desmophen 1100 obtained from Mobay Chemical Corporation, Pittsburgh, Pa.), and (III) 0.068 parts by weight of a nonionic surfactant which is a liquid fluorinated alkyl ester (FC-430 obtained from 3M Corporation).

Part B 47.67 parts by weight of polytoluene diisocyanate, containing 6 to 7% free monomer (CB-60 obtained from Mobay Chemical Co.).

Parts A and B are then mixed together. A solvent containing isopropanol and methylethylketone (in a ratio of 3/2) is added to obtain a viscosity of 18 seconds Zhan cup No. 2 at 25° C.

The prepared adhesive is sprayed onto the treated chip carrier at a uniform dry thickness of 0.002 inch. Then the adhesive coated substrate is placed in a convective oven at 200° F. for 5 minutes until the adhesive coat was dry but not fully cured.

A Tampaflex printer is then used. The carrier surface 62 has a pattern comprising a embodiment as shown FIG. 1 where ink lines are applied to the three-dimensional surface with the conductive lines are as described in the Plateability Standard Test.

The conductive pattern is formed by gravure technique on the surface 62 and transferred as shown at FIGS. 5A, 5B at a printing pressure of about 14.5 p.s.i. The ink used is formed by blending together at room temperature:

(I) 3 percent by weight of an epoxy novolak resin having an average of 3.6 oxirane groupos per molecule, having a viscosity in the range of 1100 to 1700 centipoise (at 52° C.). Its epoxy equivalent was in the range of 172 to 179. The average value of repeat units was 0.2, (D.E.N.431-obtained from Dow Chemical Co., Midland, Mich., and (II) 2 percent by weight of poly(vinyl formal) resin having a molecular weight of 10,000 to 15,000 and a solution viscosity of 100 to 200 centipoise (measured as 15% by weight in a 4:2 solution of dibasic ester[1]: (an ester mixture of 23 weight percent dimethyl succinate, 56% dimethyl glutarate, and 21 weight percent dimethyl adipate.) N-methyl pyrrolidine at 25° C.). Formvar 5/59 is obtained from Monsanto Plastic & Resins Co., St. Louis, Mo.

(III) 0.0005% by weight of trifluoro methane-sulfonic acid having a pH of 4 to 6.5.

To this mixture is added the following ingredients.

(I) 25% by weight of silver having a particle size of 2 to 12 microns, an apparent density of 21.5 to 23.5 g/in$^3$, a tap density of 1.5 to 2.5 g/in$^3$ and a weight loss at 1000° F. of approximately 1%.

(II) 70.0% by weight of nickel powder which is about 100% spherical, having an average particle size of 12 microns and an apparent density of 56.8% g/in$^3$.

This mixture is stirred at room temperature until completely homogenized and then put through a three roll mill for two passes with the back roller at 4 to 6 mil and the front roller at 1 to 3 mil. The ink was then printed by pad 60.

The device is then dried in a convection oven at 200° F. for 5 minutes. The printed pattern is then pressed with a die at a pressure of 1800 p.s.i. for 15 seconds at 450° F. to improve wire bonding properties.

After resilient pad printing by the transfer means, drying and pressing the thermoplastic of the adhesive and binder are cured to cause interaction at 360° F. for 30 minutes. The chip carrier device with the cured printed ink adhesively bound to the substrate is then electrolessly plated by dipping it in a bath of Enthone Ni418 manufactured by Enthone, Inc. of West Hartford, Conn. for 45 minutes at 88° C. This forms a nickel plating over the ink which is highly conductive having a surface resistivity of less than 0.5 ohms per square.

After plating to the desired plating thickness as for example after 45 minutes, a post cure is carried out for 30 minutes at 36° F.

The product produced by this example passes the Platability Standard Test and the Tensile Pull Strength Test of this invention and has an electrical conductivity such that surface resistivity is no more than 0.5 ohms per square.

Example 2

Example 1 is repeated except that in place of the two part adhesive composition noted, the following adhesive was substituted:

| Solids | | Percents by Weight | |
|---|---|---|---|
| | | Wet | Dry |
| 15% | Formvar 5/95 a polyvinylformal resin obtained from Monsanto Plastics and Resins Co., St. Louis, Missouri in (4/1) DBE, i.e. of the dibasic ester: N—methyl-2-pyrrolidine mixture of Example 1 (11) as used in the ink described | 77.14 | 11.50 |
| 40% | of a phenol blocked toluene dissocyanate in cellosolve acetate Mondur S in CA obtained from Mobay Chemical Co. | 17.35 | 6.94 |
| 100% | of the allyl ether of a phenol formaldehyde resin Methylon 75108 obtained from General Electric Co. | 1.15 | 1.15 |
| 100% | of hexamethyl ester of hexamethyl melamine Cymel 303 obtained from American Cyanamid | 0.86 | 0.86 |
| 100% | FC 430, a fluorocarbon non ionic surfactant obtained from Minnesota Mining and Mfg. Co. of Minneapolis, MN | 1.15 | 1.15 |
| | 4/1 of the dibasic ester: N—methyl-2-pyrrolidine mixture of Example 1 (11) as used in the ink described | 2.89 | |

| Solids | | Percents by Weight | |
|---|---|---|---|
| | | Wet | Dry |

The chip carriers produced by the method of this invention have excellent electrical and mechanical characteristics.

Example 3

Example 2 is repeated except that the metal component carrying ink of Example 1 is replaced by the following formulation.

| Solids | | Percents by Weight | |
|---|---|---|---|
| | | Wet | Dry |
| 15% | Formvar 5/95 in (4/1) DBE/N—Methyl-2-pyrrolidone | 13.20 | 1.98 |
| 100% | Epoxy Novolac Resin used in the ink of Example 1 (I) D.E.N. 431 | 3.00 | 3.00 |
| | A low aspect ratio nickel particle of 3-5 micron particle size (Inco 123 obtained from Novamet of Wyckoff, N. J. | 95.00 | 95.00 |
| | (4/1) DBE/N—Methyl-2-pyrrolidone | 10.73 | — |
| | | 121.93 | 99.98 |

Total solids = 82.00%
Viscosity = 390,000 cps ± 20,000 (Brookfield viscometer, spindle speed 2) at 29° C.
Sp. Gr. = 6.75

Example 4

Example 3 is repeated except that the ink formulation used is as follows:

| Solids | | Percents by Weight | |
|---|---|---|---|
| | | Wet | Dry |
| 15% | Formvar 5/95 in (4/1) DBE/N—Methyl-2-pyrrolidone = | 13.20 | 1.98 |
| 100% | Epoxy Novolac Resin D.E.N. 431 = | 3.00 | 3.00 |
| 100% | FC 430 = | 1.00 | 1.00 |
| | $Fe_2P$ HRS 2132, a product of Hooker Chemical Co. of Niagara Falls, NY (3 micron) particles = | 66.16 | 66.16 |
| | (4/1) DBE/N—Methyl-2-pyrrolidone = | 4.60 | |
| | | 87.96 | 72.14 |

Total solids = 82.00%
Viscosity = 390,000 cps ± 20,000 (Brookfield viscometer, spindle 7, speed 2) at 29° C.
Sp. Gr. = 4.77

In addition a surface activation of the printing ink was carried out just prior to the plating step used. In the surface activation step, palladium chloride solution formulated as follows was used:
  1000 Ml deionized water
  10 ml concentrated hydrochloride acid reagent grade
  0.5 gram powdered palladium chloride
  mix well in agitator for one hour to uniformly dissolve.

The chip carrier was dipped into the palladium chloride solution for one minute at room temperature. After rinsing with water, the chip carrier was then plated as previously done in Example 1.

Example 5

Example is repeated except that the ink formulation used is as follows:

| Solids | | Percents by Weight | |
|---|---|---|---|
| | | Wet | Dry |
| 15% | Formvar 5/95 in (4/1) DBE/N—Methyl-2-pyrrolidone = | 13.20 | 1.98 |
| 100% | Epoxy Novolac Resin D.E.N. 431 of Example 1 = | 3.00 | 3.00 |
| 100% | FC 430 = | 1.00 | 1.00 |
| | Fe₂P HRS 2132 (5 microns) = | 8.00 | 8.00 |
| | Micro 470 graphite (1 micron) obtained from Asbury Graphite Mills, Inc., Asbury, New Jersey = | 8.00 | 8.00 |
| | Fluorocarbon powders (FLUO HTG-2) (lubricant) obtained from Micro Powders, Inc., of Yonkers, NY = | 8.00 | 8.00 |
| | (4/1) DBE/N— Methyl-2-pyrrolidone = | — | |
| | | 41.20 | 29.98 |

Total solids = 72.88%
Viscosity = 340,000 cps ± 20,000 (Brookfield viscometer, spindle 7, speed 2) at 29° C.
Sp. Gr. = 2.24

In addition a surface activation of the printing ink was carried out as in Example 4.

Example 6

Example 5 is repeated except that the adhesive is replaced with the following adhesive formulation:

| Solids | | Percents by Weight | |
|---|---|---|---|
| | | Wet | Dry |
| 18% | Formvar 5/95 in (4/1) DBE/N—Methyl-2-pyrrolidone = | 55.56 | 10.00 |
| 60% | Mondur S in Cellosolve Acetate = | 10.00 | 6.00 |
| 100% | Methylon 75108 = | 1.00 | 1.00 |
| 100% | Cymel 303 = | 0.75 | 0.75 |
| 10% | Paint Additive 11 a silicone surfactant obtained from Dow Corning Co. of Midland, Michigan = | 0.50 | 0.05 |
| | (4/1) DBE/N— Methyl-2-pyrrolidone = | 14.50 | |
| | | 32.31 | 17.80 |

Example 7

Example 1 is repeated except that the Rynite 555 substrate is replaced with 35 parts by weight Polyarylethersulfone, 35 parts by weight of poly(ethylene terephthalate) (Cleartuf 7202A, obtained from Goodyear Tire and Rubber Co.), 20 parts by weight of fiberglass (OCF-497B, Owens-Corning Corp., Anderson, S.C. and 10 parts by weight of talc (reagent grade, Mallinckrodt, Inc., Paris, Ky. were blended in a single screw one-inch diameter extruder (L/D=20) equipped with a Maddox mixing head at about 275° C. and molded into chip carrier substrates of the form described in example 1.

The polyarylethersulfone used is a polymer having the following repeat unit:

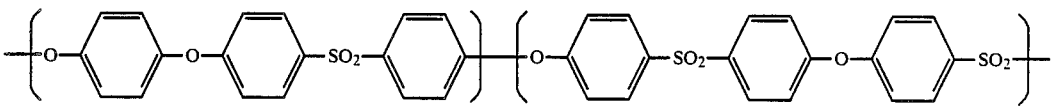

The polymer has a reduced viscosity of 0.61 dl/g as measured in N-methyl-pyrrolidinone (0.2 g/100 ml) at 25° C.

Example 8

The material in example 7 is replaced with 35 parts by weight of Polysulfone, 35 parts by weight of the poly(ethylene terephthalate) of Example 7, 20 parts by weight of fiberglass (OCF-497B, Owens-Corning Corp., Anderson, S.C.) and 10 parts by weight of talc (reagent grade, Mallinckrodt, Paris, Ky. These materials are processed in accordance with the method of examples 1 and 7.

The polymer has the following repeat unit:

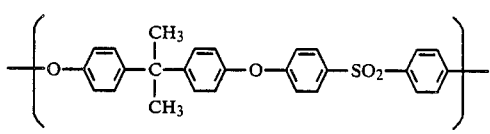

This polymer has a reduced viscosity of 0.47 dl/g as measured in chloroform (0.1 g/100 ml) at 25° C.

In all of the above examples, the platings obtained in the chip carriers are extremely useful. In the case of the nickel and the silver-nickel combinations, the devices formed pass the Plateability Standard Test and the Tensile Pull Test of this invention. In all cases, the novel and advantageous three-dimensional printing step enables formation of three-dimensional devices without later forming to form quality components with good resolution, good electrically conductive properties and good bonding properties.

While specific examples of this invention have been described and shown, it should be understood by those skilled in the art that many variations are possible. The novel printing step, inks, plating and printing sequence and the like along with the interaction materials are among the unique aspects of this invention. It should be understood that although a specific adhesive layer is preferably used, in some cases the substrate on which the ink is to be printed may itself be in a form such that is has an adhesive outer surface avoiding the need for a separate adhesive.

What is claimed is:

1. A three-dimensional device comprising a thermoplastic or thermosetting, or mixtures thereof, organic resin substantially rigid substrate having a thickness and defining a first side surface comprising an electronic component mounting area, a flange extending at an angle from the mounting area and defining a lip area having an outer peripheral edge, a particle-loaded ink lying in a plurality of distinct circuit paths and extending from the vicinity of said mounting area toward said lip, said particle of said ink comprising a metallic component, said particle-loaded ink being bound to said substrate by a curable cross-linkable thermosetting organic resin, and a conductive metal plating plated over said ink, said device having a coefficient of thermal expansion predetermined to match closely with that of an organic resin printed circuit board.

2. A three dimensional device in accordance with claim 1 in the form of an electronic chip carrier wherein, said ink has an underlying layer of a thermosetting resin adhesive and an ink binder of a compatible thermosetting organic resin, said particle of said ink comprising a metallic component.

3. A three-dimensional device in accordance with claim 2 wherein said particle is in the form of a plurality of particles selected from the group of particles consisting of precious metals such as least one of silver, gold, platimum, palladium, rhodium and ruthenium, mixtures of precious metals and non-precious metals such as nickel, non-precious metals such as nickel alone and metal-containing materials such as $Fe_2P$.

4. A three-dimensional device in accordance with claim 2 wherein said circuit path extends over said surface from the vicinity of said mounting area along the angle of said flange and over said lip to said outer peripheral edge to provide a good fileted solder bond with a circuit board to which the device is soldered.

5. A three-dimensional device in accordance with claim 4 wherein said chip carrier has an outer parameter within the scope of a 0.4" to 2.5" square.

6. A three-dimensional device in accordance with claim 5 wherein said ink is printed on a substrate by a yieldable printing means capable of conforming to a three-dimensional surface to provide good resolution and fine lines of conductive path on said substrate, and said device meets the Plateability Standard Test and the Tensile Pull Strength Test.

7. A three-dimensional device comprising an organic resin substrate in accordance with claim 6 wherein said ink is bound to said substrate by a cured resin and said ink comprises a thermosetting resin binder such that the cured resin and binder resin are capable of functionally reacting.

8. A three-dimensional device in accordance with claims 1, 2 or 6 wherein ink is compacted prior to applying said plating to provide a smooth surface on said plating suitable for wire bonding.

9. A three-dimensional device in accordance with the device of claim 2 in combination with a printed circuit board having conductive paths adapted to coincide with said three-dimensional device conductive paths, said conductive paths of said circuit board and three-dimensional devices being in registration and solder bonded to each other to provide an enclosed housing for an electronic device mounted on said mounting area.

10. A combination in accordance with claim 9 wherein said solder bonding extends to a portion of said conductive path of said three-dimensional device which portion extends over said peripheral edge thereby providing a fileted seal and solder bond to said circuit board.

11. A three-dimensional device in accordance with claim 2 wherein said organic resin has a moisture absorption of below 0.05%.

12. In an electrically conductive device having an electrically insulating substrate, the improvement comprising a circuit pattern comprising a deposited layer of $Fe_2P$ particles and an electrically conductive layer plated thereover.

* * * * *

UNITED STATES PATENT OFFICE
CERTIFICATE OF CORRECTION

Patent No. 4,759,970             Dated July 26, 1988

Inventor(s) Richard Earle Seeger, Noredin Hassan Morgan

It is certified that error appears in the above-identified patent and that said Letters Patent are hereby corrected as shown below:

PATENT

| Column | Line | | |
|---|---|---|---|
| 8 | 33-34 | "aminated" should read | --laminated-- |
| 8 | 55 | "0.003" should read | --0.0003-- |
| 9 | 45 | "0.0012" should read | --0.012-- |
| 10 | 50 | "plaalting" should read | --plating-- |
| 12 | 8 | "40.8" should read | --40.88-- |
| 12 | 51 | "4:2" should read | --4:1-- |
| 13 | 20 | "36°F." should read | --360°F.-- |
| 18 | 15 | "1,2 or 6" should read | --1,2 and 6-- |

Signed and Sealed this

Seventh Day of March, 1989

Attest:

DONALD J. QUIGG

*Attesting Officer*      *Commissioner of Patents and Trademarks*